United States Patent
Shen et al.

(10) Patent No.: US 10,658,184 B2
(45) Date of Patent: May 19, 2020

(54) PATTERN FIDELITY ENHANCEMENT WITH DIRECTIONAL PATTERNING TECHNOLOGY

(71) Applicant: Taiwan Semiconductor Manufacturing Co., Ltd., Hsinchu (TW)

(72) Inventors: Yu-Tien Shen, Hsinchu (TW); Chi-Cheng Hung, Miaoli County (TW); Chin-Hsiang Lin, Hsin-chu (TW); Chien-Wei Wang, Zhubei (TW); Ching-Yu Chang, Yilang County (TW); Chih-Yuan Ting, Taipei (TW); Kuei-Shun Chen, Hsinchu (TW); Ru-Gun Liu, Hsinchu County (TW); Wei-Liang Lin, Hsin-Chu (TW); Ya Hui Chang, Hsinchu (TW); Yuan-Hsiang Lung, Hsinchu (TW); Yen-Ming Chen, Chu-Pei (TW); Yung-Sung Yen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 6 days.

(21) Appl. No.: 15/474,522

(22) Filed: Mar. 30, 2017

(65) Prior Publication Data

US 2018/0174853 A1    Jun. 21, 2018

Related U.S. Application Data

(60) Provisional application No. 62/434,997, filed on Dec. 15, 2016.

(51) Int. Cl.
*H01L 21/265* (2006.01)
*H01L 21/311* (2006.01)
*H01L 21/033* (2006.01)

(52) U.S. Cl.
CPC .... *H01L 21/26586* (2013.01); *H01L 21/0337* (2013.01); *H01L 21/31116* (2013.01); *H01L 21/31144* (2013.01)

(58) Field of Classification Search
CPC ............. H01L 21/3081; H01L 21/0274; H01L 21/26586; H01L 21/3086
See application file for complete search history.

(56) References Cited

U.S. PATENT DOCUMENTS

| 7,557,007 B2 * | 7/2009 | Shimoyama ...... H01L 29/66621 257/E21.155 |
| 8,133,804 B1 | 3/2012 | Godet et al. |

(Continued)

FOREIGN PATENT DOCUMENTS

| KR | 100653534 | 11/2006 |
| KR | 20130124149 | 11/2013 |

(Continued)

OTHER PUBLICATIONS

Cho, Sung-Woon et al., "Single- and Multi-Directional Slanted Plasma Etching of Silicon under Practical Plasma Processing Conditions", ECS Journal of Solid State Science and Technology, 3(11), Sep. 10, 2014, pp. Q215-Q220.

*Primary Examiner* — Phat X Cao
*Assistant Examiner* — Victor V Barzykin
(74) *Attorney, Agent, or Firm* — Haynes and Boone, LLP

(57) ABSTRACT

A method for semiconductor manufacturing includes providing a substrate and a patterning layer over the substrate; forming a hole in the patterning layer; applying a first directional etching along a first direction to inner sidewalls of the hole; and applying a second directional etching along a second direction to the inner sidewalls of the hole, wherein the second direction is different from the first direction.

12 Claims, 20 Drawing Sheets

(56) References Cited

U.S. PATENT DOCUMENTS

| | | |
|---|---|---|
| 8,216,767 B2 | 7/2012 | Wang et al. |
| 8,323,870 B2 | 12/2012 | Lee et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,741,551 B2 | 6/2014 | Wu et al. |
| 8,980,108 B1 | 3/2015 | Yu et al. |
| 9,153,478 B2 | 10/2015 | Liu et al. |
| 9,190,498 B2* | 11/2015 | Brand ............... H01L 29/66803 |
| 9,466,486 B2 | 10/2016 | Shieh et al. |
| 9,984,889 B2* | 5/2018 | Ruffell ............... H01L 21/3065 |
| 2006/0166419 A1* | 7/2006 | Shimoyama ...... H01L 29/66621 |
| | | 438/173 |
| 2009/0023098 A1* | 1/2009 | Jain .................... H01L 21/0277 |
| | | 430/296 |
| 2011/0186749 A1 | 8/2011 | Godet et al. |
| 2013/0129991 A1* | 5/2013 | Ndoye ................. G03F 7/2022 |
| | | 428/195.1 |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0272728 A1 | 9/2014 | Sinclair et al. |
| 2014/0273521 A1 | 9/2014 | Wu et al. |
| 2016/0064239 A1 | 3/2016 | Shih et al. |
| 2017/0263460 A1* | 9/2017 | Ruffell ............. H01J 37/32403 |
| 2018/0082844 A1* | 3/2018 | Sherman ............. H01L 21/2633 |

FOREIGN PATENT DOCUMENTS

| | | |
|---|---|---|
| KR | 20130138786 | 12/2013 |
| WO | WO2011/116039 | 9/2011 |

* cited by examiner

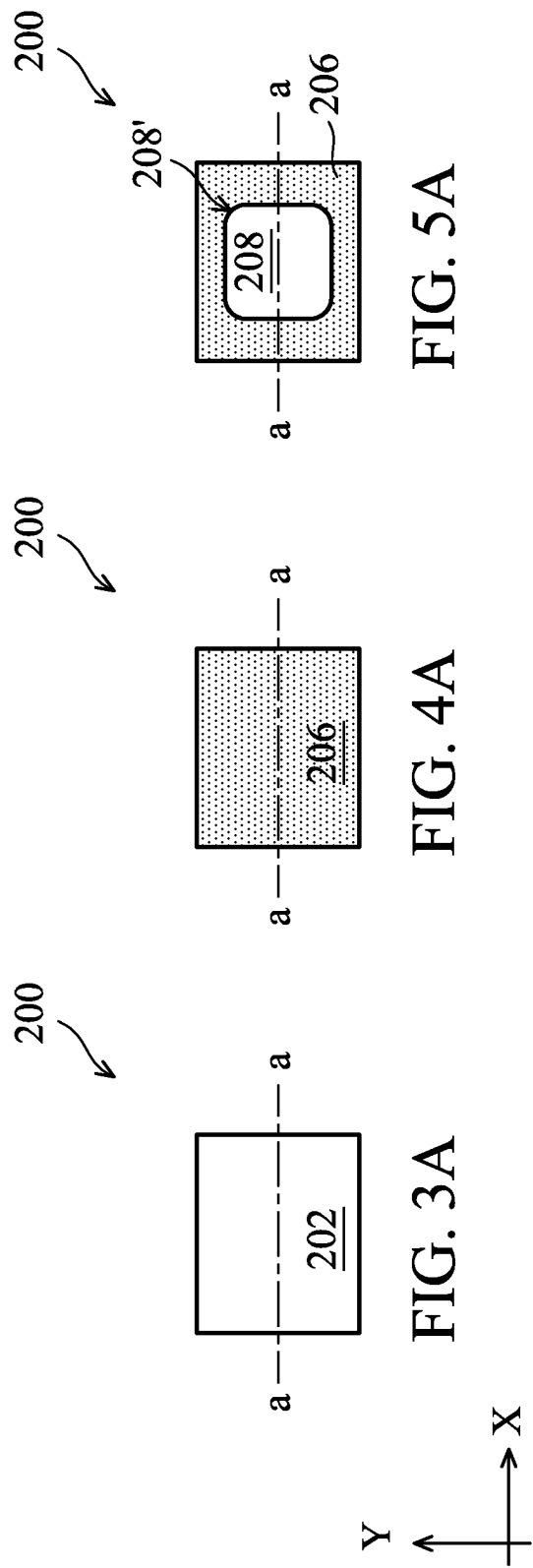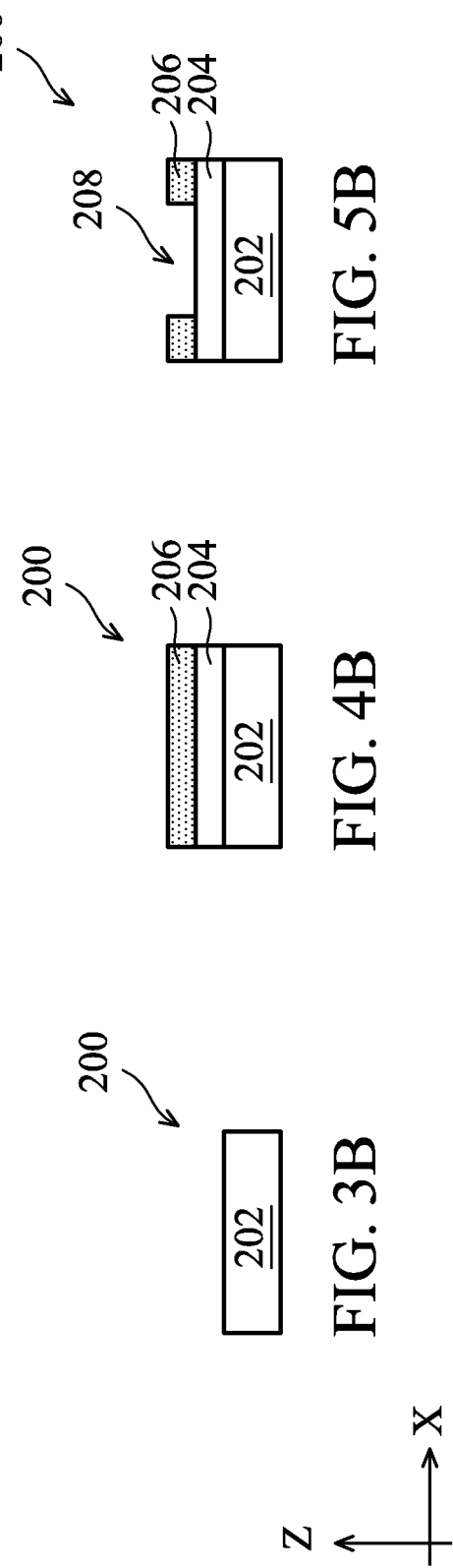

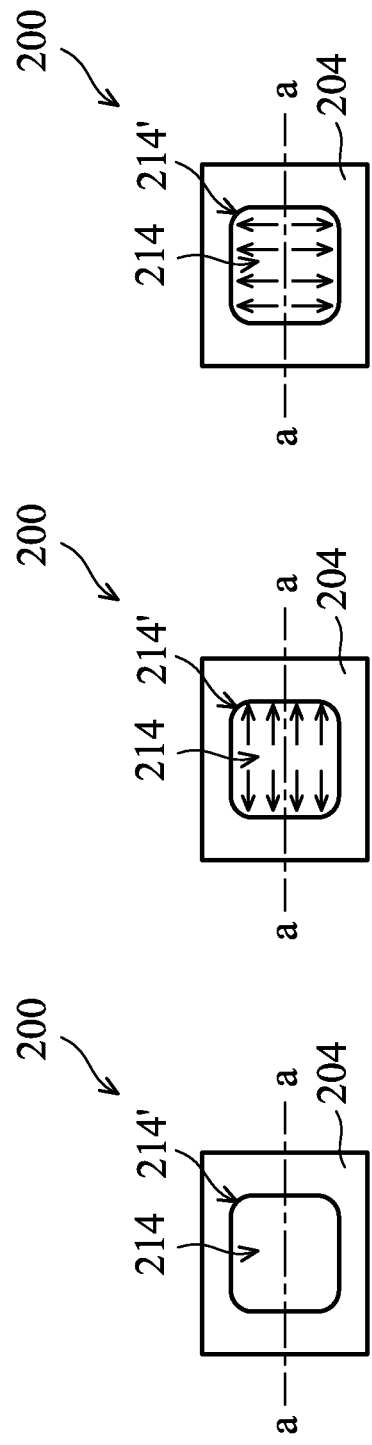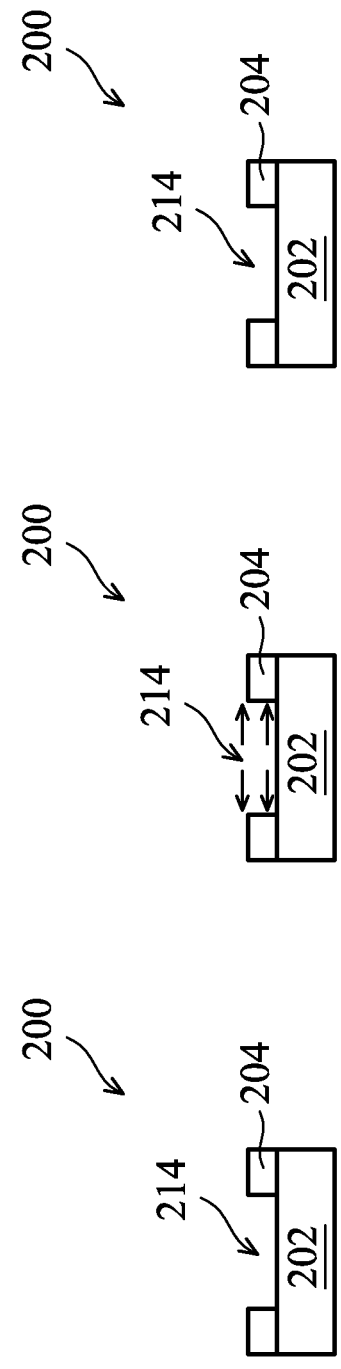

PATTERN FIDELITY ENHANCEMENT WITH DIRECTIONAL PATTERNING TECHNOLOGY

PRIORITY

This claims the benefits of U.S. Prov. No. 62/434,997, entitled "Pattern Fidelity Enhancement with Directional Patterning Technology," filed Dec. 15, 2016, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, the issue of pattern corner rounding has become more prominent in smaller process nodes. Pattern corner rounding refers to the phenomenon that right angles in a design pattern become rounded during photolithography (e.g., photoresist pattern) and etching processes (e.g., hard mask patterns). This issue directly affects the process window and critical dimension (CD) variation control during semiconductor manufacturing. Hence, methods for reducing pattern corner rounding are highly desirable.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 9A, and 10A illustrate top views of a device during various stages of manufacturing according to the method in FIG. 2 in accordance with some embodiment.

FIGS. 3B, 4B, 5B, 6B, 7B, 8A, 8B, 9B, and 10B illustrate cross-sectional views of a device during various stages of manufacturing according to the method in FIG. 2 in accordance with some embodiment.

FIGS. 11A, 12A, 13A, 14A, and 15A illustrate top views of another device during various stages of manufacturing according to the method in FIG. 2 in accordance with some embodiment.

FIGS. 11B, 12B, 13B, 14B, and 15B illustrate cross-sectional views of another device during various stages of manufacturing according to the method in FIG. 2 in accordance with some embodiment.

DETAILED DESCRIPTION

Figure 1:
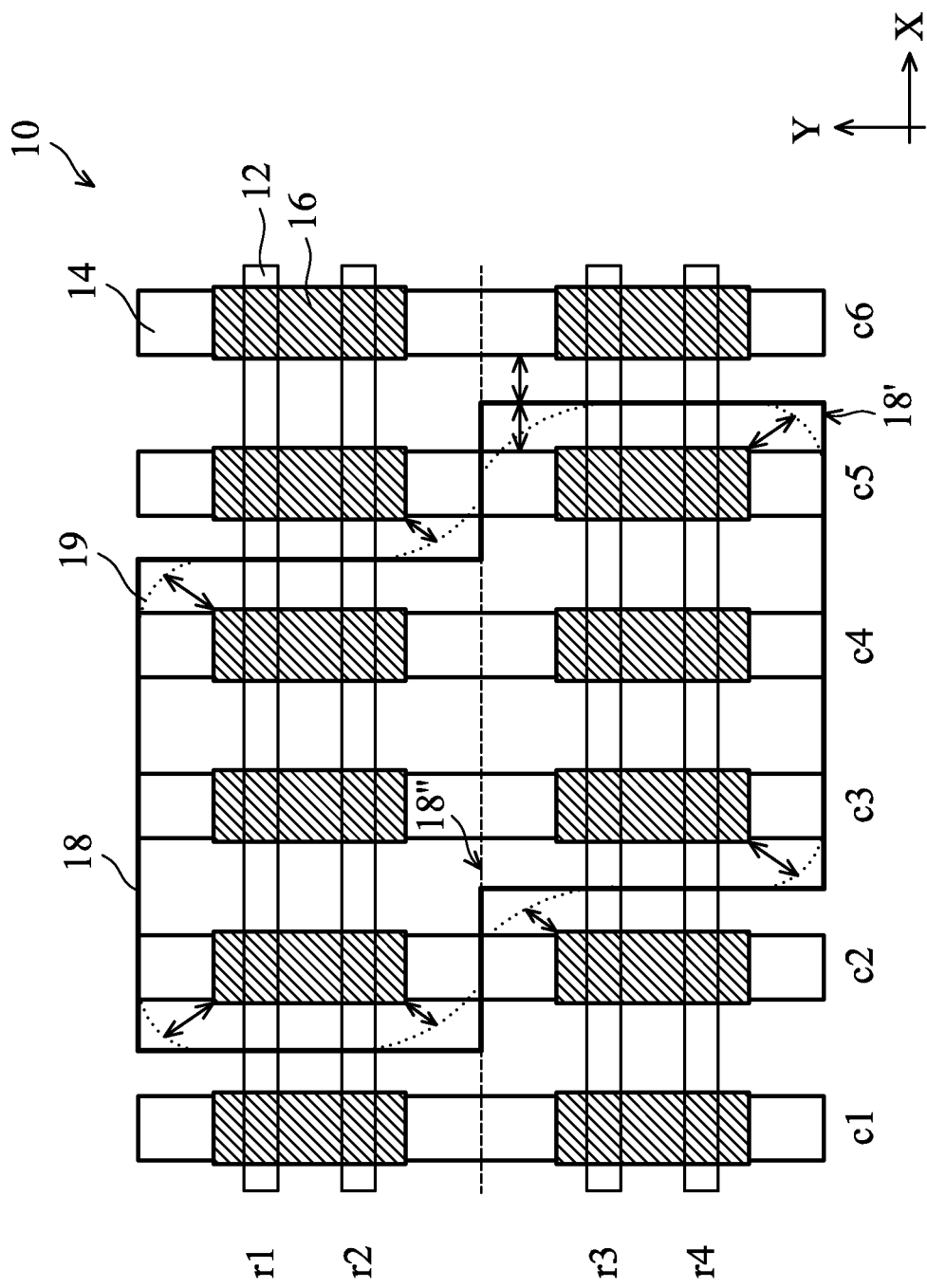
FIG. 1 illustrates an integrated circuit design according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to forming a pattern or device for an integrated circuit (IC) using photolithography (or lithography) processes, and more particularly to methods for overcoming pattern corner rounding issues and enhancing pattern fidelity during photolithography processes.

FIG. 1 illustrates a layout of an IC 10 according to an embodiment of the present disclosure. Referring to FIG. 1, the IC 10 includes a plurality of active regions 12 oriented lengthwise along the X direction, and a plurality of gate structures 14 oriented lengthwise along the Y direction perpendicular to the X direction. At each intersection of the active regions 12 and the gate structures 14, a field effective transistor (FET) is formed. In an embodiment, the active regions 12 have a fin-like shape and the FETs formed thereon are FinFETs. FIG. 1 shows four rows (r1, r2, r3, and r4) of active regions 12 and six columns (c1, c2, c3, c4, c5, and c6) of the gate structures 14, which form 24 FETs. In some designs, it is desired that some of the transistors have different physical and/or electrical characteristics than the others. For example, the transistors that are enclosed by the box 18 (transistor type-1) may have a different threshold voltage (Vt) than those outside the box 18 (transistor type-2). For example, transistor type-1 may be designed to have high Vt, while transistor type-2 may be designed to have low Vt. This may be desirable, for example, in SRAM cell designs and/or peripheral circuit designs.

To implement the IC 10, one approach is to form a masking element that covers the transistors of type-1 (or the transistors of type-2), while processing the transistors of type-2 (or the transistors of type-1) during certain processing stages, such as ion implantation. The masking element may comprise a resist material or a hard mask material, and may be made through photolithography processes. The boundary formed by the box 18 may sit right in the middle of adjacent features, i.e., between the gate structures 14 horizontally and between the active regions 12 vertically. In the example shown in FIG. 1, the box 18 includes six right-angle outer corners (convex corners) 18' and two right-angle inner corners (concave corners) 18". In various embodiments, the shape of the box 18 may be simpler or more complex than the one shown in FIG. 1. The shape of the box 18 represents a target pattern to be formed through photolithography processes.

Ideally, the actual masking element conforms to the exact dimensions of the target pattern (e.g., the box 18). However, due to optical effects and/or etching bias during the photolithography processes, the masking element typically does not conform to the target pattern exactly. Instead, the contour 19 of the actual masking element has rounded corners, which brings the masking element closer to some of the IC features, especially at the corners. This reduced distance represents lost design margin. FIG. 1 further shows shaded regions 16 around the transistors. The shaded regions 16 represent areas that the contour 19 of the masking element may not touch. For example, the shaded regions 16 may account for process variations such as critical dimension variations and overlay variations. The distance between the contour 19 and the shaded regions 16 represents the design margin. As the dimensions of the IC continue to scale down, it becomes more and more critical that the contour 19 of the actual masking element closely matches the boundary of the target pattern (e.g., the box 18) throughout lithography patterning processes. The present disclosure provides one or more embodiments that address the corner rounding issues in lithography patterning processes. The provided subject matter can be applied to various IC designs in addition to or alternative to the IC 10.

Figure 2:
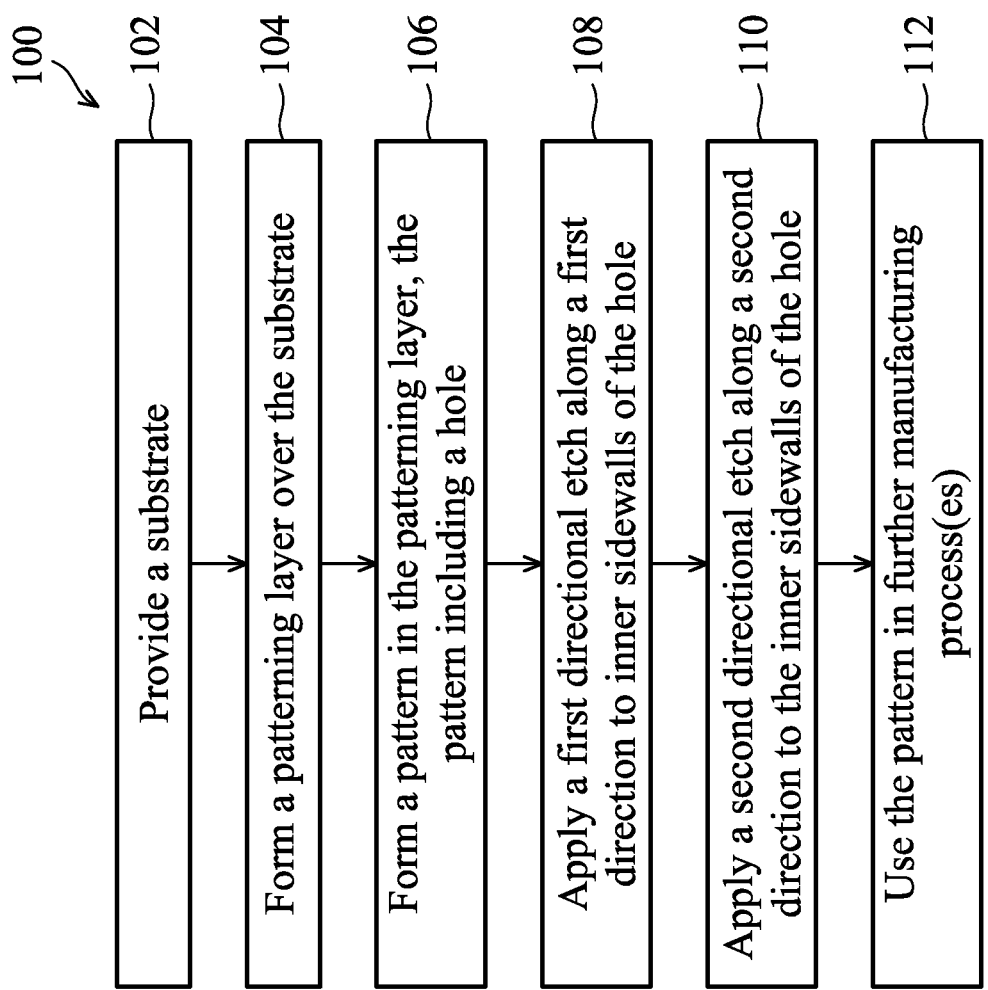
FIG. 2 illustrates a flow chart of a method for overcoming corner rounding issues, e.g., in a hole-type pattern, according to an embodiment of the present disclosure.

Referring to FIG. 2, shown therein is a flow chart of a method 100 for forming a pattern having a hole-type pattern (or hole) with improved shapes in the corners. The method 100 is an example, and is not intended to limit the present disclosure beyond what is explicitly recited in the claims. Additional operations can be provided before, during, and after the method 100, and some operations described can be replaced, eliminated, or moved around for additional embodiments of the method.

In an embodiment, the method 100 forms a hole-type pattern with near 90° corners by applying two directional etching processes which are tuned to etch along two perpendicular directions. Further, the method 100 can be used to form hole-type resist patterns or hole-type hard mask (HM) patterns. FIGS. 3A-10B illustrates top and cross-sectional views of a device 200 during various manufacturing steps according to a first embodiment of the method 100, wherein the two directional etching processes are applied to a hole-type resist pattern. FIGS. 11A-15B illustrates top and cross-sectional views of the device 200 during various manufacturing steps according to a second embodiment of the method 100, wherein the two directional etching processes are applied to a hole-type HM pattern. In various embodiments, the first and second embodiments may be applied individually or jointly during photolithography processes. For example, photolithography processes may treat resist patterns only, hard mask patterns only, or both resist patterns and hard mask patterns according to embodiments of the method 100. The method 100 is described below by referring to FIG. 2 and FIGS. 3A-10B.

At operation 102, the method 100 (FIG. 2) provides a substrate 202 (FIGS. 3A-3B). In various embodiments, the substrate 202 includes one or more material layers and may be in an intermediate step of a fabrication process to form the device 200. The device 200 may be an IC, or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The device 200 may include three-dimensional devices and multi-gate devices such as double gate FETs, FinFETs, tri-gate FETs, omega FETs, Gate-All-Around (GAA) devices, and vertical GAA devices. In an embodiment, the substrate 202 is a semiconductor substrate (e.g., wafer). In an embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

At operation 104, the method 100 (FIG. 2) forms a patterning layer over the substrate 202. In the present embodiment as shown in FIGS. 4A-4B, the operation 104 forms a hard mask (or HM) layer 204 over the substrate 202, and a resist layer 206 over the hard mask layer 204. In this embodiment, the resist layer 206 is the patterning layer. In various embodiments, other material layers may be added between the resist layer 206 and the hard mask layer 204. Also, in some embodiments, other material layers may be added between the hard mask layer 204 and the substrate 202.

The hard mask layer 204 may comprise amorphous silicon (a-Si), silicon oxide, silicon nitride (SiN), titanium nitride (TiN), silicon oxynitride (SiON), silicon carbon nitride (SiCN), or other suitable material or composition; and may be formed by chemical vapor deposition (CVD), low pressure chemical vapor deposition (LPCVD), plasma enhanced chemical vapor deposition (PECVD), physical vapor deposition (PVD), atomic layer deposition (ALD), or other suitable deposition method.

In an embodiment, the resist layer 206 is formed by a spin coating process followed by a soft baking process. The resist layer 206 can be a positive resist or a negative resist. A positive resist is normally insoluble in a resist developer, but is made soluble by exposure to a radiation such as a deep ultraviolet (DUV) ray or an extreme ultraviolet (EUV) ray. One exemplary positive resist material is chemically amplified resist (CAR). A negative resist has the opposite behavior—normally soluble in a resist developer, but is made insoluble by exposure to a radiation, such as a DUV ray or an EUV ray. One exemplary negative resist is a polymer which forms intra-molecular and/or intermolecular cross links when irradiated, such as a polymerization of Ethyl(α-hydroxy)acrylate (EHMA) and methacryl acid (MAA).

At operation 106, the method 100 (FIG. 2) forms one or more patterns in the patterning layer and the one or more patterns include a hole-type pattern 208 (FIGS. 5A-5B). In the present embodiment, the resist layer 206 is the patterning layer, and the hole-type pattern 208 (hereinafter "the hole 208") is formed in the resist layer 206. In an embodiment, patterning the resist layer 206 includes exposing the resist layer 206 to a radiation, post-exposure baking, developing the resist layer 206 in a resist developer, and hard baking thereby removing exposed portion (or unexposed in the case of negative resist) of the resist layer 206. The remaining portion of the resist layer 206 becomes a resist pattern having the hole 208. The hole 208 is designed to be rectangular in the present embodiment. However, due to optical effects of the exposing process among other factors, the corners 208' of the hole 208 become rounded.

Figure 6A:
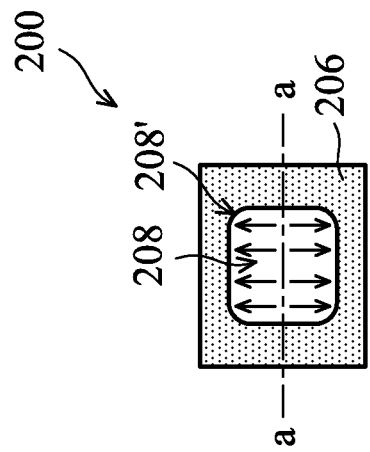
Figure 6B:
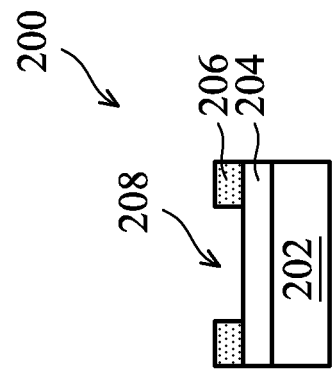

At operation 108, the method 100 (FIG. 2) applies a first directional etching along a first direction to the inner sidewalls of the hole 208. Referring to FIGS. 6A and 6B, the first directional etching is applied along the X direction in this embodiment.

Figure 7A:
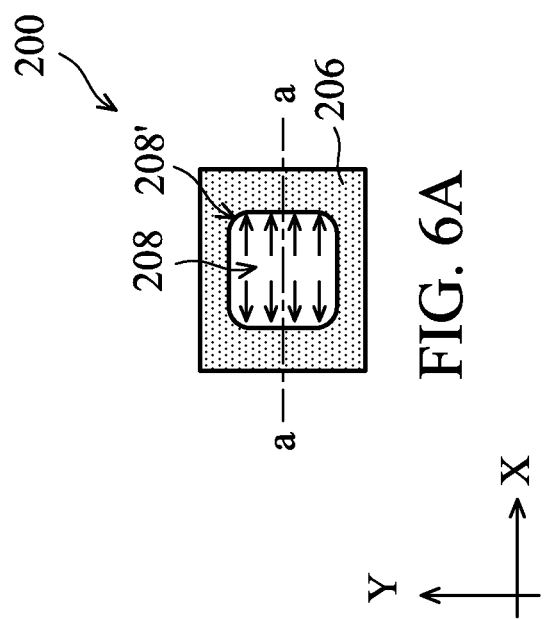
Figure 7B:
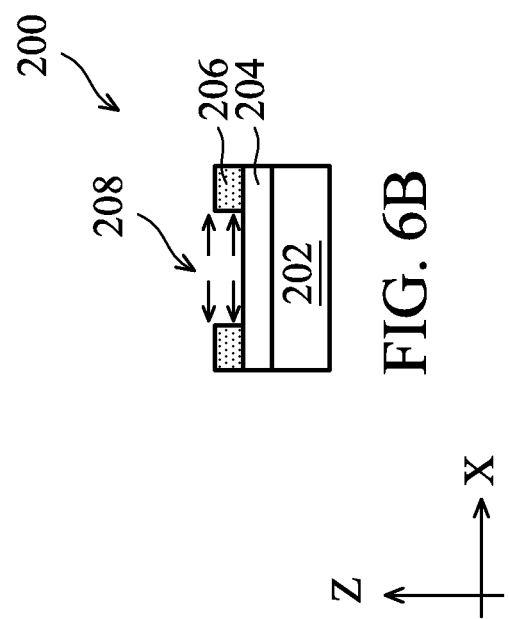

At operation 110, the method 100 (FIG. 2) applies a second directional etching along a second direction to the inner sidewalls of the hole 208, wherein the second direction is different from the first direction. Referring to FIGS. 7A and 7B, the second directional etching is applied along the Y direction. In this embodiment, the X and Y directions are perpendicular. Further, the first and second directional etching are selective to the resist pattern 206 and do not etch (or etches insignificantly) the hard mask layer 204 in the present embodiment. In another embodiment, operations 108 and 110 may be applied simultaneously in one etching process that provides both first and second directional etching at the same time.

Figure 8B:
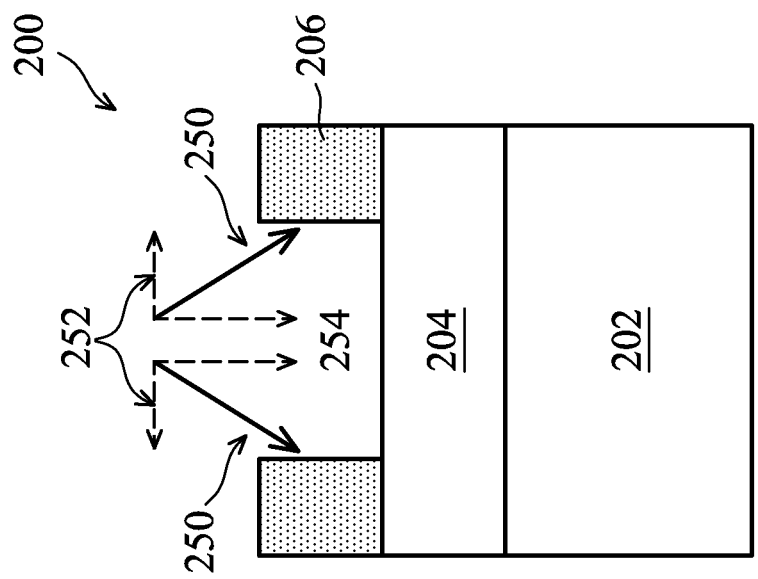
Figure 8A:
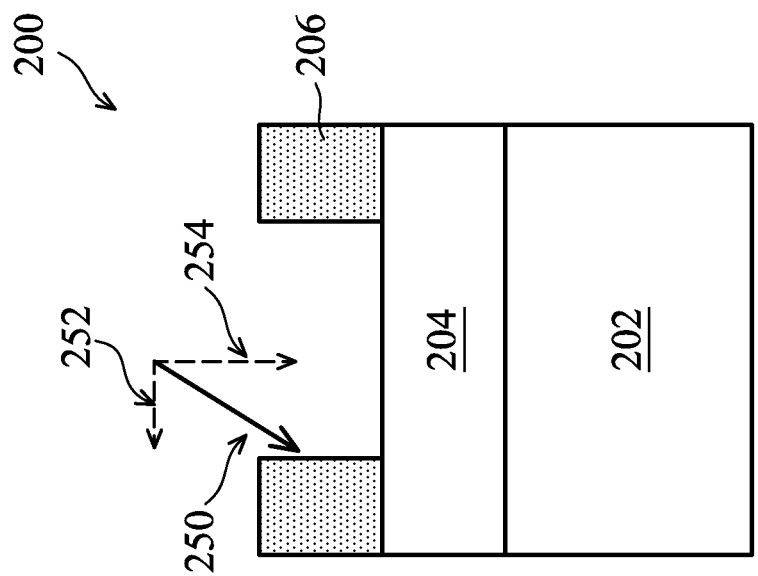

In each of the operations 108 and 110, the first and second directions are in a plane parallel to the top surface of the substrate 202. In various embodiments, the first and second directional etching also have a vertical component, i.e., along the Z direction that is normal to the top surface of the substrate 202. In an embodiment, each of the operation 108 and the operation 110 may include a slanted plasma etching process that is biased towards the X or Y direction. Examples of slanted plasma etching process are illustrated in FIGS. 8A and 8B. Referring to FIG. 8A, the plasma ion beam 250 is tilted away (slanted) from the direction Z, and has an effective horizontal component 252 and an effective vertical component 254. The plasma ion beam 250 may include argon ions in an embodiment. Alternatively, the plasma ion beam 250 may include helium, silane, methane, oxygen, nitrogen, carbon dioxide, or combinations thereof. The device 200 may be mounted on a wafer stage and is scanned along the X direction, the Y direction, or another direction perpendicular to the Z direction. The ion beam 250 remains at the same angle (or angular distribution) while the wafer stage is moved. In the example shown in FIG. 8A, the ion beam 250 has a unimodal angular distribution. In the example shown in FIG. 8B, the ion beam 250 has a bimodal angular distribution wherein the ion beam 250 etches the resist pattern 206 along two directions simultaneously. By tuning the incident angle and angular distribution of the ion beam 250, the horizontal (along the X and/or Y direction) etching rate can be well controlled.

During the operations 108 and 110, the portions of the sidewalls of the hole 208 near the corners 208' are etched more than other portions of the sidewalls because they receive more etchants or more ion bombardments than the other portions. For example, they may receive etchants or ion bombardments in both of the operations 108 and 110, while the other portions (e.g., side center) may receive etchants or ion bombardments in one, but not both, of the operations 108 and 110. As a result, the corners 208' become sharper and each has a substantially 90° angle.

Figure 10A:
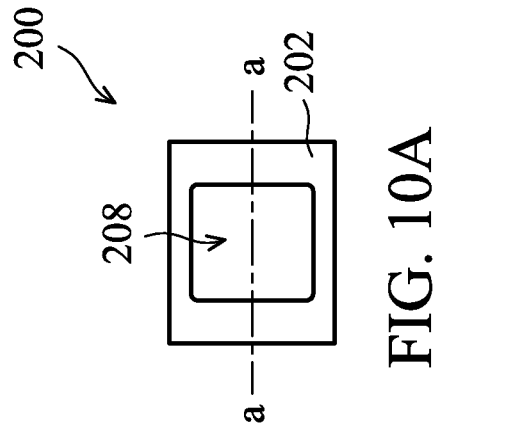
Figure 10B:
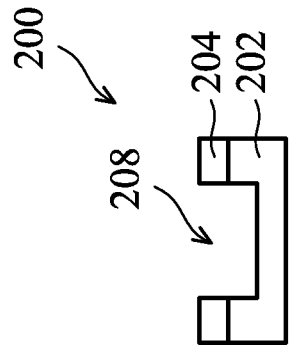
Figure 9A:
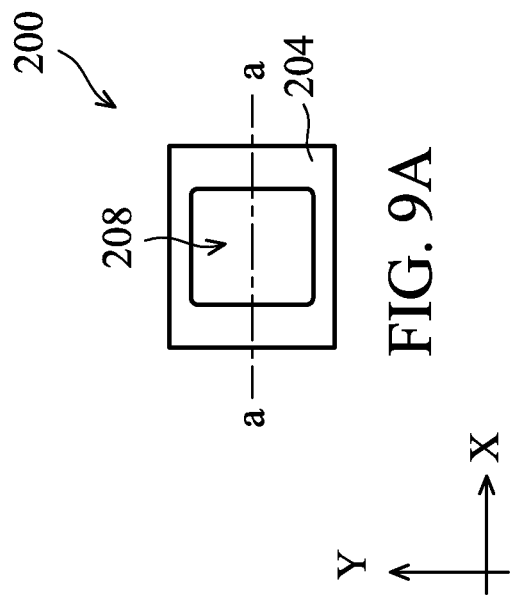
Figure 9B:
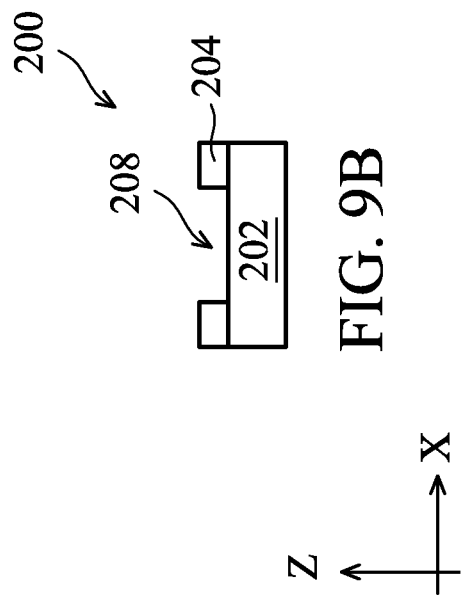

At operation 112, the method 100 (FIG. 1) uses the treated resist pattern 206 in further manufacturing processes. In an embodiment, the method 100 transfers the hole pattern 208 to the substrate 202. In this embodiment, the hole pattern 208 is first transferred to the hard mask layer 204 (FIGS. 9A-9B) and is then transferred to the substrate 202 (FIGS. 10A-10B). Referring to FIGS. 9A-9B, the hard mask layer 204 is etched with the treated resist pattern 206 as an etch mask. For example, the hard mask layer 204 may be etched using a wet etching process, a dry etching process, an atomic layer etching process, or other suitable etching processes. The resist pattern 206 may be partially consumed during this etching process. Remaining portions of the resist pattern 206, if any, is removed, for example, by a resist stripping process. Referring to FIGS. 10A-10B, the substrate 202 is etched with the patterned hard mask layer 204 (or hard mask pattern 204) as an etch mask, thereby transferring the hole pattern 208 to the substrate 202. The method 100 (FIG. 1) may perform further steps to form a final pattern or device. For example, in an embodiment, the hole 208 is a contact hole. To further this embodiment, the method 100 may form a contact plug in the contact hole 208 by forming a barrier layer on the sidewalls of the hole 208 and forming a metal layer over the barrier layer.

In another embodiment, the method 100 (FIG. 1) uses the treated resist pattern 206 or a derivative thereof (e.g., the hard mask pattern 204) as an ion implantation masking element instead of an etch mask. For example, the method 100 may form the resist layer 206 over the substrate 202 without the hard mask layer 204. After the resist layer 206 has been exposed and developed, it is further treated with the dual directional etching processes discussed above to improve the profile of its corners. Thereafter, the treated resist pattern 206 is used as a masking element in an ion implantation process to the substrate 202.

FIGS. 11A-15B illustrates top and cross-sectional views of the device 200 during various manufacturing steps according to a second embodiment of the method 100, wherein the two directional etching processes are applied to a hole-type hard mask pattern. Many respects of this embodiment are similar to those described with respect to FIGS. 3A-10B.

Referring to FIGS. 11A-11B, the method 100 forms a hole pattern 214 in the hard mask layer 204 which is the patterning layer of the operations 104 and 106 (FIG. 1). In an embodiment, the hole pattern 214 may be formed using photolithography processes, where the resist pattern (etch mask) is not treated with the dual directional etching processes discussed above. The corners 214' of the hole pattern 214 are undesirably rounded. In an alternative embodiment, the hole pattern 214 may be formed using photolithography processes such as described above with respect to FIGS. 3A-9B, where the resist etch mask (e.g., resist pattern 206) is treated with the dual directional etching processes according to the present disclosure. However, after transferring the pattern 214 from the resist pattern to the hard mask layer 204, the profile of the hole pattern 214 may not be ideal and further treatments are desired to sharpen the corners 214'.

Figure 15A:
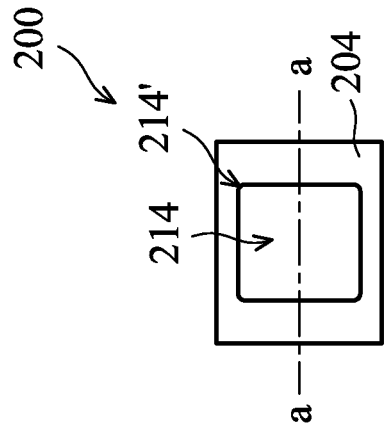
Figure 15B:
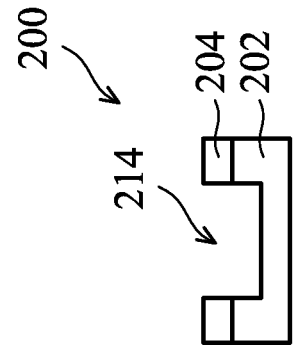
Figure 14A:
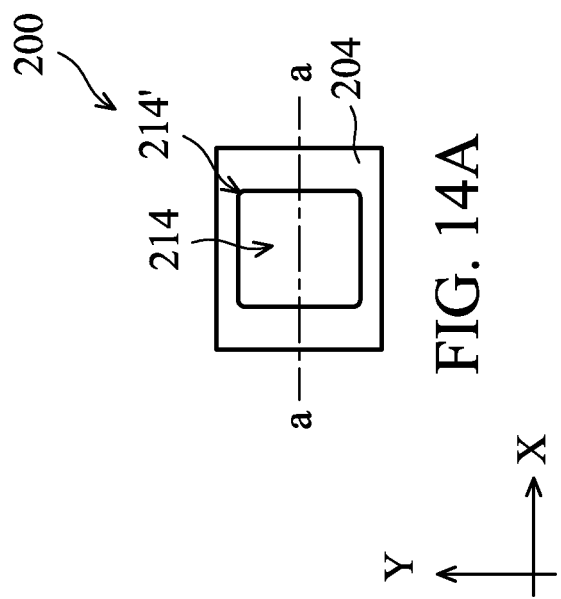
Figure 14B:
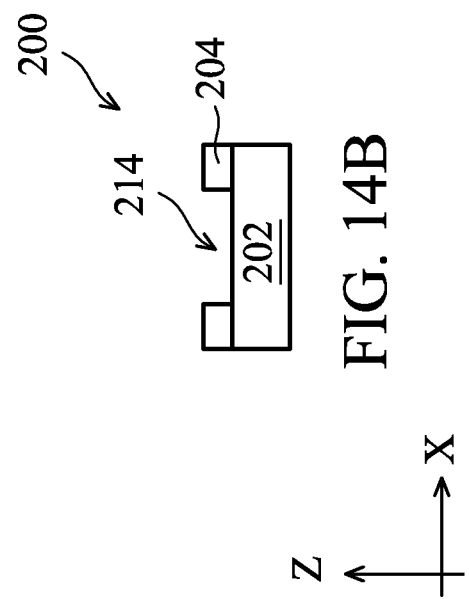

Referring to FIGS. 12A-12B, the method 100 (FIG. 1, operation 108) applies a first directional etching to the inner sidewalls of the hole pattern 214. In the present embodiment, the first directional etching is applied along the X direction. Referring to FIGS. 13A-13B, the method 100 (FIG. 1, operation 110) applies a second directional etching to the inner sidewalls of the hole pattern 214. In the present embodiment, the second directional etching is applied along the Y direction, perpendicular to the X direction. In an embodiment, the first and second directional etching to the hole pattern 214 may be applied simultaneously. Further, each of the first and second directional etching to the hole pattern 214 may include a vertical component, i.e., along the Z direction. The etching to the hole pattern 214 may be selective to the hard mask layer 204 and does not etch the substrate 202. In an embodiment, the etching to the hole pattern 214 may be implemented using a slanted plasma etching process, as discussed above. As a result of the dual directional etching to the hole pattern 214 as illustrated in FIGS. 12A-13B, the corners 214' of the hole pattern 214 become sharper and each has a substantially 90° angle (FIGS. 14A-14B). Referring to FIGS. 15A-15B, the method 100 (FIG. 2, operation 112) etches the substrate 202 with the patterned hard mask layer 204 as an etch mask. Due to the improved profile in the corners 214' of the pattern 214, the profile of the pattern or device in the substrate 202 is also improved.

Figure 16:
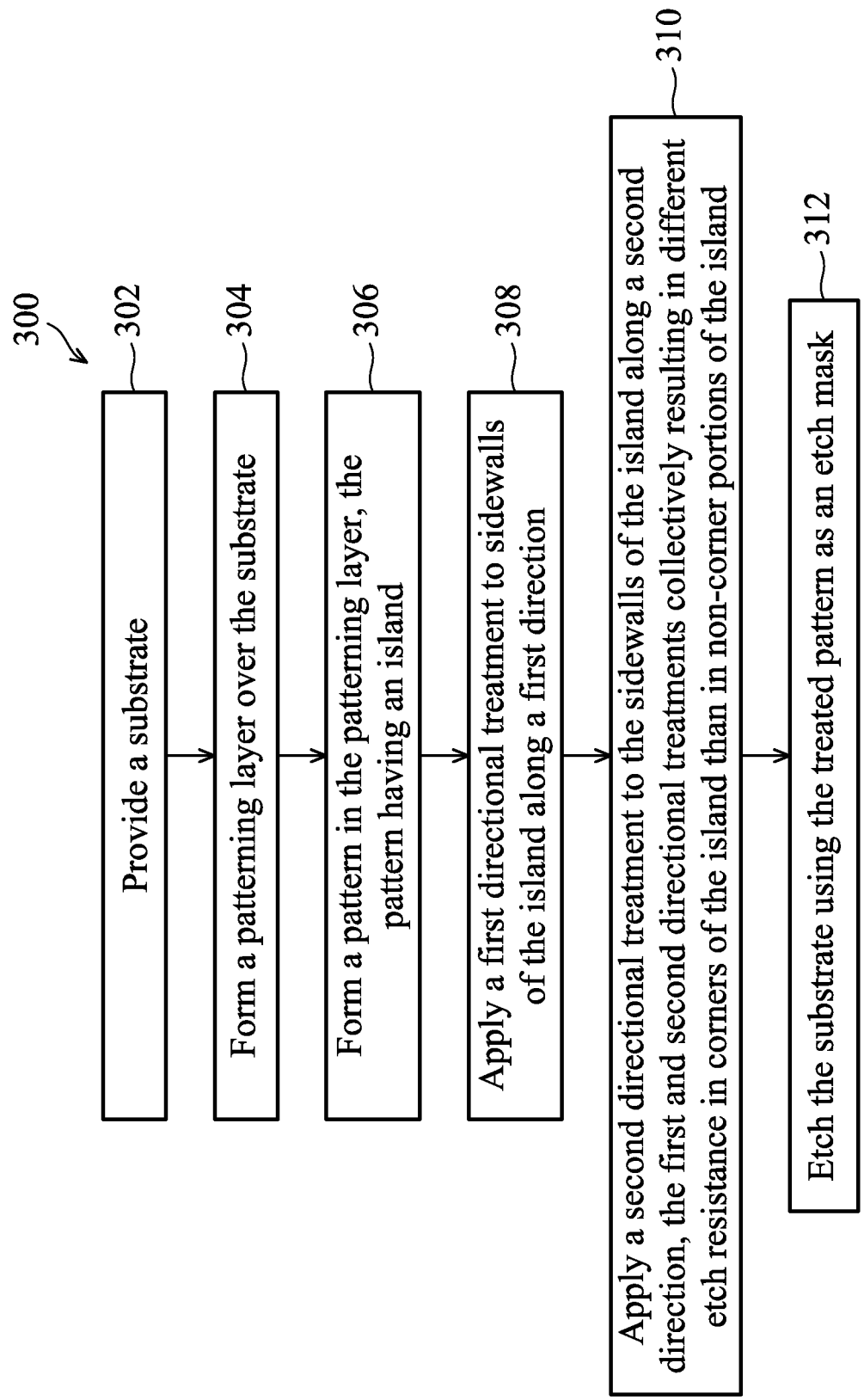
FIG. 16 illustrates a flow chart of a method for overcoming corner rounding issues, e.g., in an island-type pattern, according to an embodiment of the present disclosure.

FIG. 16 illustrates a flow chart of a method 300 for treating an island-type pattern to convert rounded corners to right-angle corners. The method 300 includes operation 302 for providing a substrate; operation 304 for forming a patterning layer over the substrate; and operation 306 for forming a pattern in the patterning layer, the pattern having an island-type pattern (or island pattern). The method 300 further includes operation 308 for applying a first directional treatment to sidewalls of the island pattern along a first direction; and operation 310 for applying a second directional treatment to the sidewalls of the island pattern along a second direction different from the first direction. As a result of the two directional treatments, the corners of the island pattern attain different etch resistance than the non-corner portions of the island pattern. The method 300 further includes operation 312 for etching the substrate using the treated island pattern as an etch mask. Due to the different etch resistances in the corner and non-corner portions of the island pattern, the pattern formed in the substrate 202 has an improved profile, such as having substantially 90° angles. In various embodiments, the patterning layer of the method 300 may be a resist layer or a hard mask layer. FIGS. 17-22B illustrate an embodiment of the method 300 (referred to as method 350) where an island resist pattern is treated by two directional treatments. FIGS. 23-28B illustrate an embodiment of the method 300 (referred to as method 400) where an island hard mask pattern is treated by two directional treatments.

Figure 17:
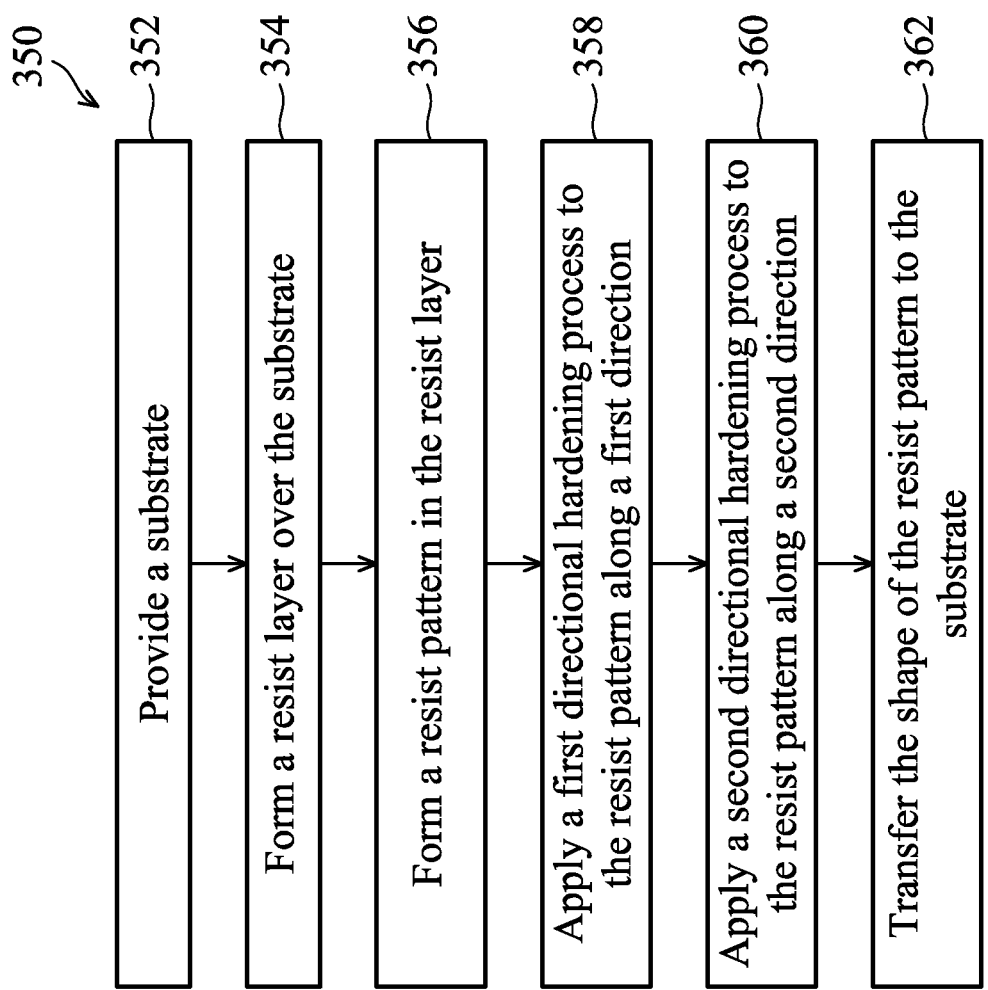
FIG. 17 illustrates a flow chart of a method for overcoming corner rounding issues, e.g., in an island-type resist pattern, according to an embodiment of the present disclosure.
Figure 18A:
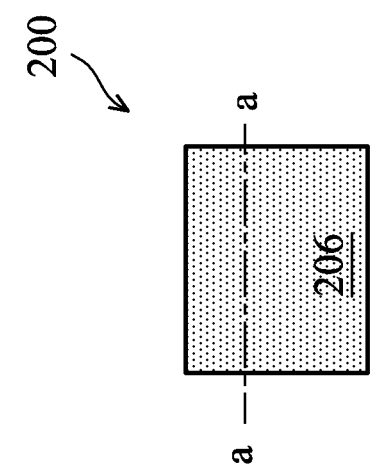
FIGS. 18A, 19A, 20A, 21A, and 22A illustrate top views of a device during various stages of manufacturing according to the method in FIG. 17 in accordance with some embodiment.
Figure 19A:
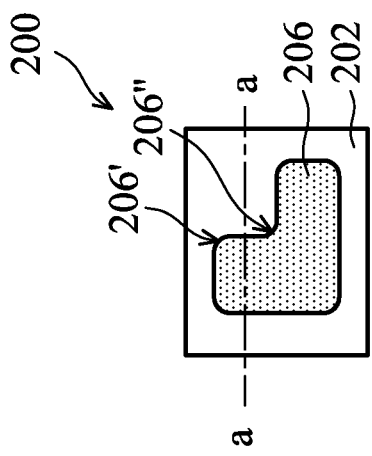
Figure 18B:
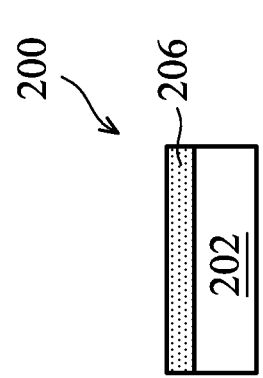
FIGS. 18B, 19B, 20B, 21B, and 22B illustrate cross-sectional views of a device during various stages of manufacturing according to the method in FIG. 17 in accordance with some embodiment.
Figure 19B:
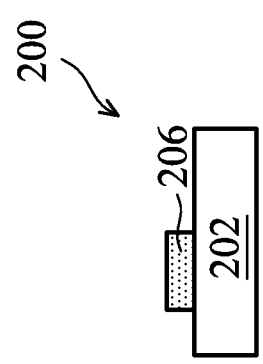
Figure 20B:
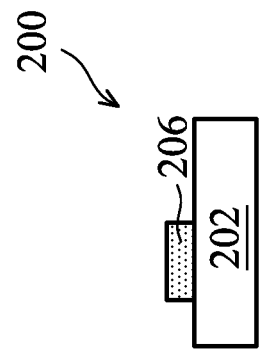

Referring to FIG. 17, the method 350 provides a substrate 202 (operation 352) and forms a resist layer 206 over the substrate 202 (operation 354), such as shown in FIGS. 18A-18B. In various embodiments, there may be one or more layers of material (such as a hard mask layer) between the resist layer 206 and the substrate 202. At operation 356, the method 350 forms a resist pattern in the resist layer 206, which is referred to as the resist pattern 206. The resist pattern 206 is designed to have right-angle corners. However, due to various factors in the photolithography process (such as exposure and developing), the corners of the resist pattern 206 become rounded. An example of the resist pattern 206 is shown in FIGS. 19A-19B. In this particular example, the resist pattern 206 has an L-shape with five outer corners 206' and one inner corner 206". In various examples, the resist pattern 206 may have a rectangular shape or other polygonal shapes with right angles.

At operation 358, the method 350 applies a first directional treatment to sidewalls of the resist pattern 206 along a first direction, such as along the X direction. At operation 360, the method 350 applies a second directional treatment to sidewalls of the resist pattern 206 along a second direction, such as along the Y direction. In an embodiment, each of the first and second directional treatments includes an ion implantation process which hardens the sidewalls of resist pattern 206 in the direction of the treatment. For example, the ion implantation process may use a gaseous ion source such as argon, helium, silane, methane, oxygen, nitrogen, carbon dioxide, or combinations thereof. Further, the ion implantation process may include a vertical component (along the Z direction) in addition to the X and/or Y components. For example, the ion implantation process may be tilted away from the normal to the top surface of the substrate 202, such as illustrated in FIGS. 8A and 8B. The ions penetrate into the resist pattern 206 up to certain depths, and may cause chemical reactions therein. As a result, the outer layer of the resist pattern 206 attains a higher etch resistance (becomes "hardened") than the inner portion of the resist pattern 206.

Figure 20A:
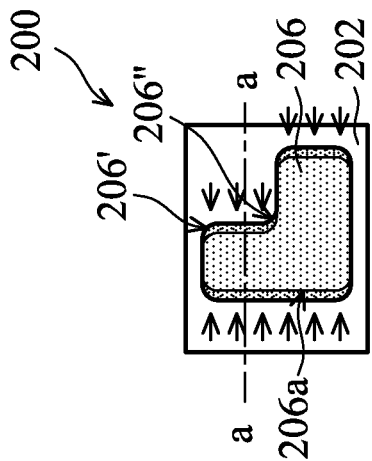
Figure 21A:
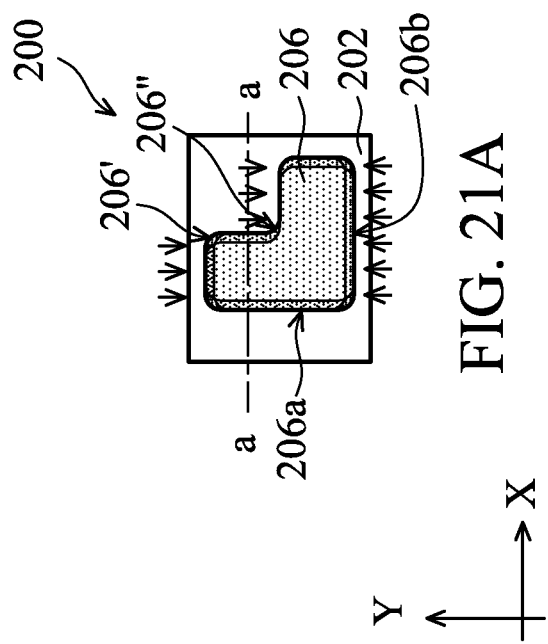
Figure 21B:
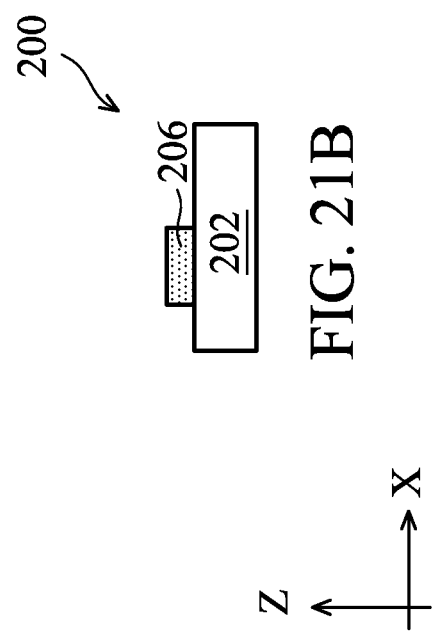

As illustrated in FIG. 20A, the Y-oriented sidewalls 206a and the corners 206' and 206" receive the first treatment and become "hardened." As illustrated in FIG. 21A, the X-oriented sidewalls 206b and the corners 206' and 206" receive the second treatment and become "hardened." It is noted that the corners 206' and 206" receive more ion treatments than the sidewalls 206a and 206b. Therefore, the corners 206' and 206" have a higher etch resistance than the sidewalls 206a and 206b, which in turn have a higher etch resistance than the inner portion of the resist pattern 206. In a further embodiment, the outer corners 206' have a higher etch resistance than the inner corners 206" because overlapping of the ion treatments in the outer corners 206' is more than that in the inner corners 206".

Figure 22A:
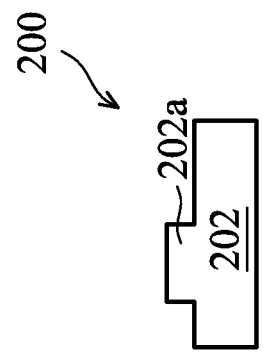
Figure 22B:
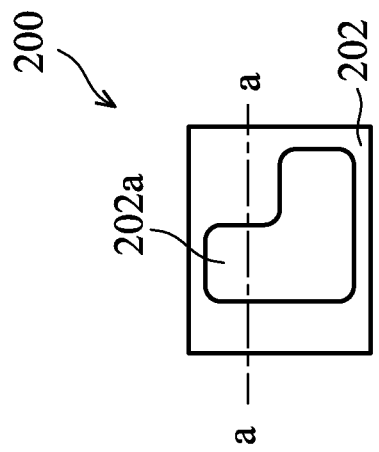

At operation 362, the method 350 transfers the shape of the resist pattern 206 to the substrate 202 by using the resist pattern 206 as an etch mask, thereby forming a pattern 202a in the substrate 202 (FIGS. 22A-22B). In a typical etching process, a resist pattern may shrink during the etching process due to being subjected to etchants or plasma ions. Furthermore, corners of an island-type resist pattern (as well as corners of the pattern that is transferred from the island-type resist pattern) usually become rounded because etchants or plasma ions attack the corners from both sides. In the present embodiment, since the corners of the resist pattern 206 are treated to have a higher etch resistance, they shrink less than the sidewall portions 206a and 206b during the etching process. As a result, the pattern 202a has an improved profile in its corners. For example, the corners of the pattern 202a may be substantially 90 degrees. Furthermore, when an island-type resist pattern has both inner corners and outer corners that are rounded, the method 350 may provide a better treatment for the outer corners than the inner corners. In other words, the method 350 may convert rounded outer corners (e.g., 206') to more closely match right angles than it does to inner corners (e.g., 206"). Therefore, for applications where the shape of the outer corners is more critical than that of the inner corners, the method 350 may be particularly advantageous.

In another embodiment, the method 350 forms a hard mask layer between the substrate 202 and the resist layer 206, such as shown in FIG. 4B. To further this embodiment, the operation 362 etches the hard mask layer using the treated resist pattern 206 as an etch mask, and etches the substrate 202 using the etched hard mask layer as an etch mask.

Figure 23:
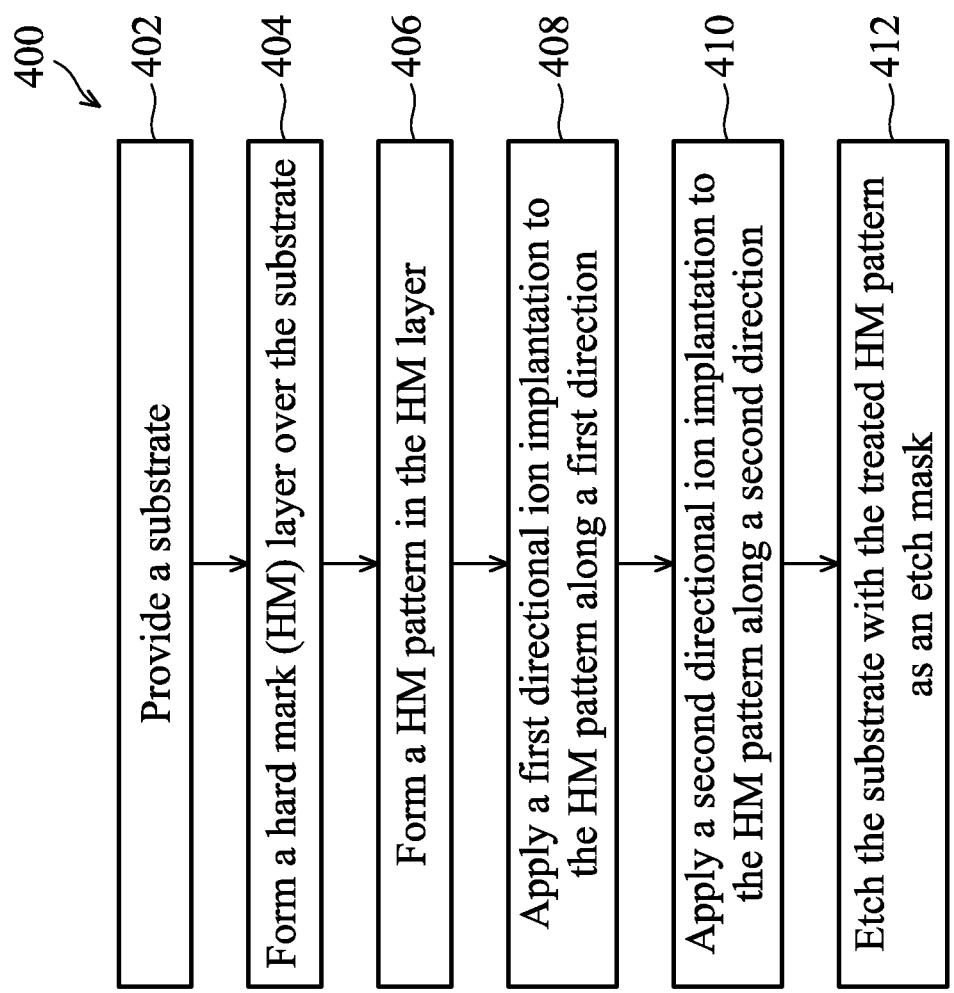
FIG. 23 illustrates a flow chart of a method for overcoming corner rounding issues, e.g., in an island-type hard mask pattern, according to an embodiment of the present disclosure.
Figure 24A:
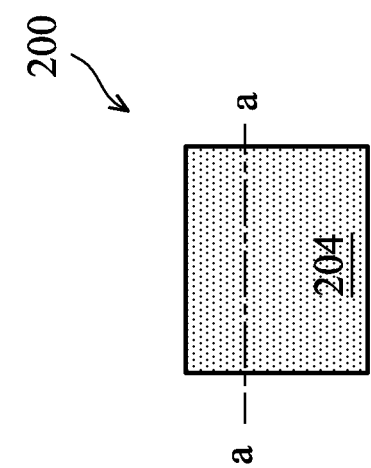
FIGS. 24A, 25A, 26A, 27A, and 28A illustrate top views of a device during various stages of manufacturing according to the method in FIG. 23 in accordance with some embodiment.
Figure 24B:
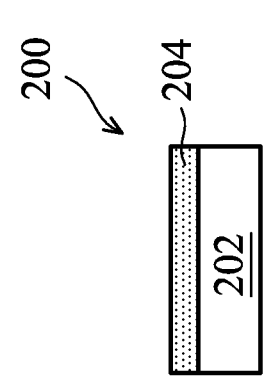
FIGS. 24B, 25B, 26B, 27B, and 28B illustrate cross-sectional views of a device during various stages of manufacturing according to the method in FIG. 23 in accordance with some embodiment.

FIG. 23 illustrates a flow chart of the method 400 where an island hard mask (HM) pattern is treated by two directional treatments. Referring to FIG. 23, the method 400 provides a substrate 202 at operation 402 and forms a hard mask (HM) layer 204 over the substrate 202 at operation 404, as shown in FIGS. 24A-24B. In various embodiments, there may be one or more layers of material between the HM layer 204 and the substrate 202.

Figure 25A:
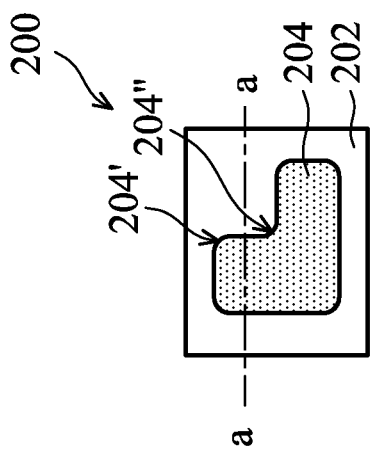
Figure 25B:
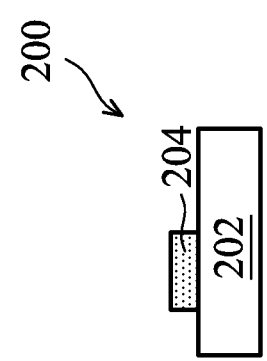

At operation 406, the method 400 forms an island-type HM pattern in the HM layer 204 using one or more photolithography processes. The island-type HM pattern is referred to as the HM pattern 204. The HM pattern 204 is designed to have right-angle corners. However, due to various factors in the photolithography processes, the corners of the HM pattern 204 become rounded. An example of the HM pattern 204 is shown in FIGS. 25A-25B. In this particular example, the HM pattern 204 has an L-shape with five outer corners 204' and one inner corner 204". In various examples, the HM pattern 204 may have a rectangular shape or other polygonal shapes with right angles. In the present embodiment, the HM pattern 204 includes amorphous silicon. In alternative embodiments, the HM pattern 204 may include other materials, such as discussed with respect to FIG. 4B.

Figure 26A:
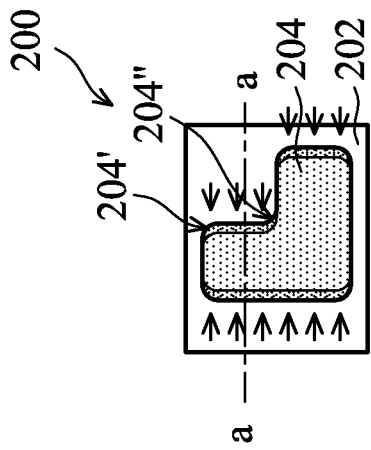
Figure 26B:
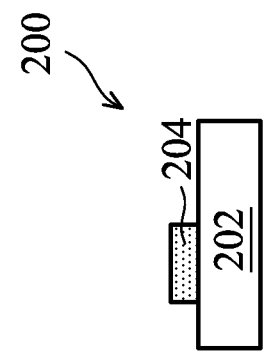
Figure 28A:
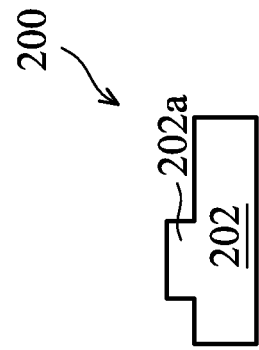
Figure 28B:
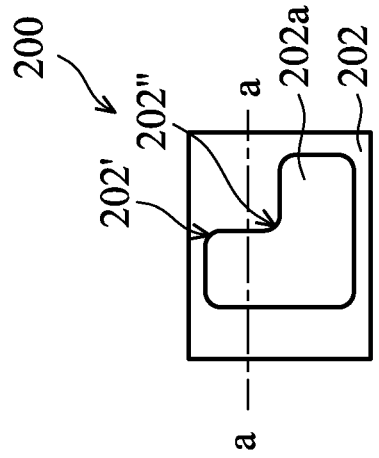
Figure 27A:
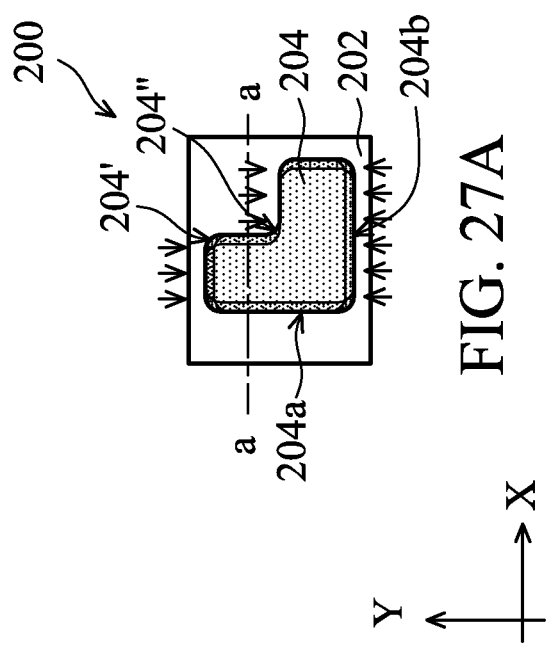
Figure 27B:
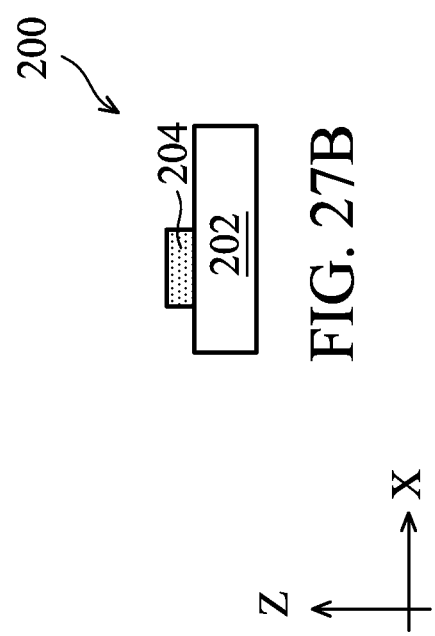

At operation 408, the method 400 applies a first directional treatment to sidewalls of the HM pattern 204 along a first direction, such as along the X direction (FIGS. 26A-26B). At operation 410, the method 400 applies a second directional treatment to sidewalls of the HM pattern 204 along a second direction, such as along the Y direction (FIGS. 27A-27B). In an embodiment, each of the first and second directional treatments includes an ion implantation process which reduces the etch resistance of the sidewalls of HM pattern 204 in the direction of the treatment. For example, the ion implantation process may use a gaseous ion source such as nitrogen, oxygen, or a combination thereof. Further, the ion implantation process may include a vertical component (along the Z direction) in addition to the X and/or Y components. For example, the ion implantation process may be tilted away from the normal to the top surface of the substrate 202.

The ions penetrate into the HM pattern 204 up to certain depths, and may cause chemical reactions to produce one or more chemical compounds therein. For example, in an embodiment, the HM pattern 204 includes amorphous silicon and treatments with nitrogen ions produce silicon nitride in the sidewall of the HM pattern 204. As a result, the chemical composition of the outer portion of the HM pattern 204 becomes different than the inner portion of the HM pattern 204. The change of composition in the HM pattern 204 may be paired with the choice of etching chemical in a subsequent etching step in order to improve the profile of the corners in the etched pattern. For example, when the HM pattern 204 comprises amorphous silicon and is implemented with nitrogen ions, etching resistance to $H_3PO_4$ in the treated portion of the HM pattern 204 becomes lower than that of the untreated portions thereof.

At operation 412, the method 400 (FIG. 23) etches the substrate 202 with the treated HM pattern 204 as an etch mask, thereby providing a pattern 202a in the substrate 202. The pattern 202a has inner corners 202" and outer corners 202', which are transferred from the inner corners 204" and the outer corners 204', respectively. In the present embodiment, the etching chemical is selective to the substrate 202, and may further etch the treated HM pattern 204. As discussed above, the ion treatments and the etching chemical can be designed such that the untreated portion of the HM pattern 204 has a high etch resistance to the etching chemical, while the treated portion of the HM pattern 204 has a relatively lower etch resistance to the etching chemical. Particularly, since the corners 204' and 204" receive more ion treatments than the sidewalls 204a and 204b, the corners 204' and 204" have an even lower etch resistance than the sidewalls 204a and 204b. This helps produce substantially 90° angles in the corners 202' and 202" even when the corners 204' and 204" are rounded. In a further embodiment, the outer corners 204' have a lower etch resistance to the selected etching chemical than the inner corners 204" because overlapping of the treatments in the outer corners 204' is more than that in the inner corners 204". As a result, the inner corner 202" matches a 90° angle more closely than the outer corners 202'. Hence, for applications where the shape of the inner corners is more critical than that of the outer corners, the method 400 may be particularly advantageous.

Figure 29:
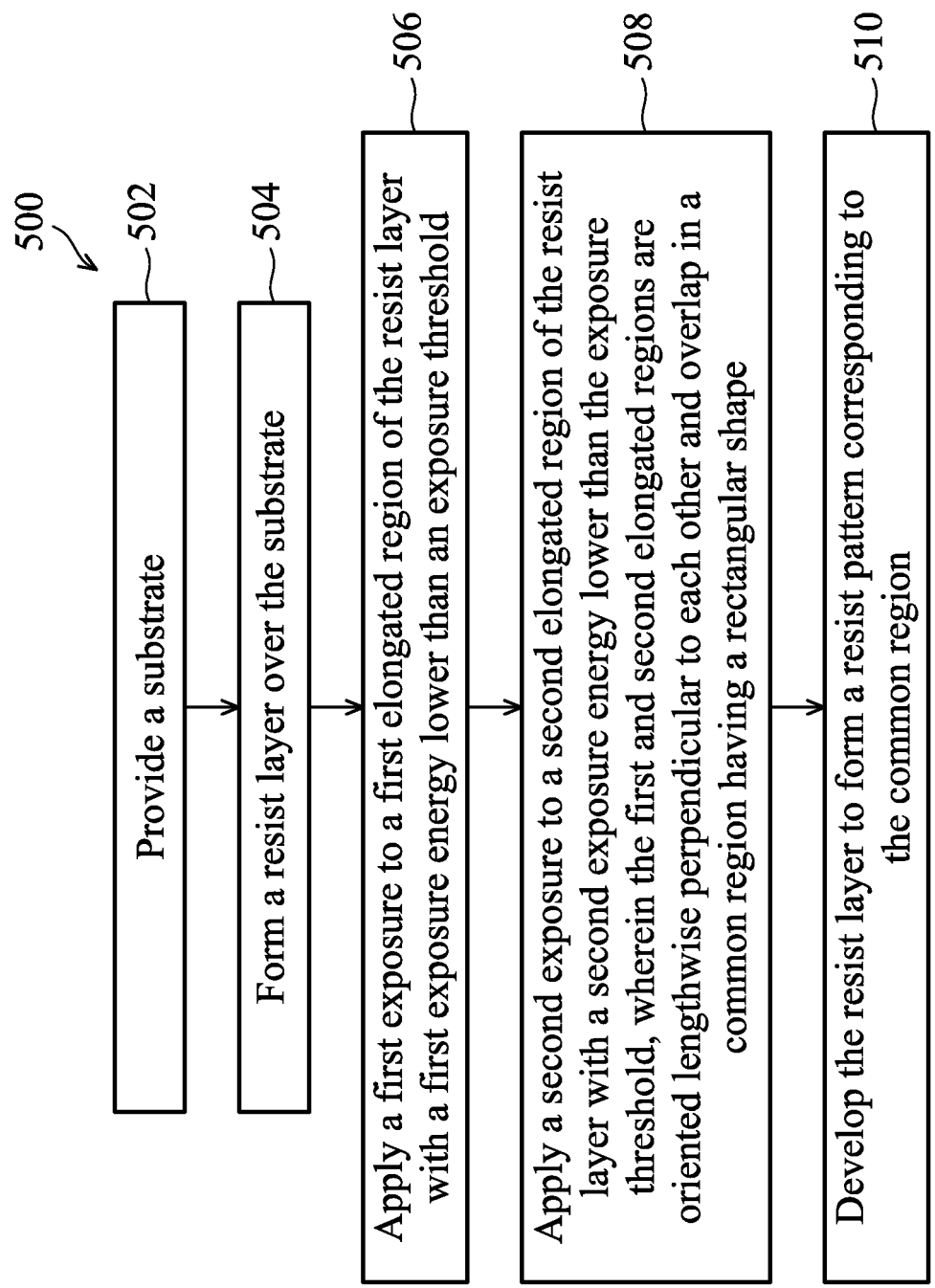
FIG. 29 illustrates a flow chart of a method for overcoming corner rounding issues during photolithography stage according to an embodiment of the present disclosure.

FIG. 29 illustrates a flow chart of a method 500 for overcoming corner rounding issues during a photolithography exposure stage according to an embodiment of the present disclosure. The method 500 is discussed below in conjunction with FIGS. 30-34.

At operation 502, the method 500 provides a substrate, such as the substrate 202 of FIG. 3B. At operation 504, the method 500 forms a resist layer, such as the resist layer 206 of FIG. 4B or FIG. 18B, over the substrate. In embodiments, the method 500 may form one or more layers of material (e.g., a hard mask layer) between the substrate and the resist layer.

Figure 30:
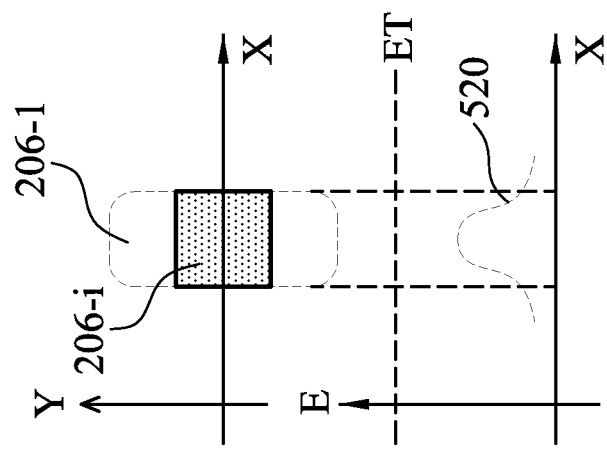

At operation 506, the method 500 applies a first exposure to a first elongated region 206-1 of the resist layer in a photolithography process. Referring to FIG. 30, the first exposure applies an exposure energy (or radiation energy) dosage 520 to the resist region 206-1. The exposure dosage 520 is below the exposure threshold (ET) of the resist material included in the resist layer. In other words, the resist region 206-1 is not fully exposed by the first exposure. Also illustrated in FIG. 30, the corners of the elongated resist region 206-1 may become rounded due to optical effects.

Figure 31:
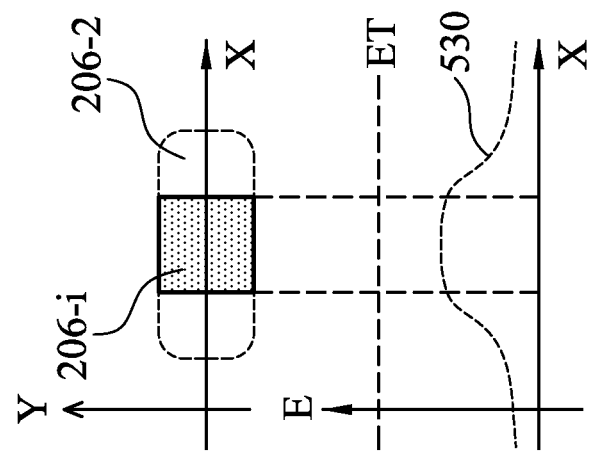

At operation 508, the method 500 applies a second exposure to a second elongated region 206-2 of the resist layer in the photolithography process. Referring to FIG. 31, the second exposure applies an exposure energy dosage 530 to the resist region 206-2 and the exposure dosage 530 is also below the exposure threshold (ET) of the resist material included in the resist layer. Also illustrated in FIG. 31, the corners of the elongated resist region 206-2 may become rounded due to optical effects.

Figure 32:
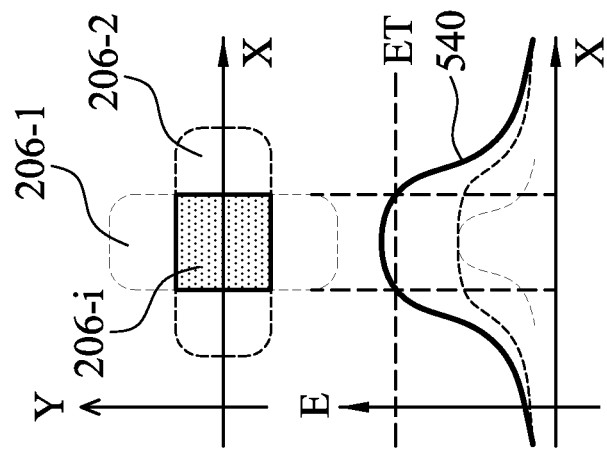
FIGS. 30, 31, and 32 illustrate different exposure dosages during photolithography according to the method of FIG. 29, in accordance with an embodiment.

In the present embodiment, the first and the second resist regions, 206-1 and 206-2, are oriented lengthwise perpendicular to each other. The intersection (or common region) 206-i (FIG. 32) of the two resist regions 206-1 and 206-2 receives the exposure dosages 520 and 530, and becomes fully exposed. In other words, the exposure dosage received by the intersection 206-i exceeds the exposure threshold (ET) of the resist material included in the resist layer, such as shown in FIG. 32. It is noted that the intersection 206-i is in a rectangular shape. When the resist layer is subsequently developed, the intersection 206-i becomes a developed resist pattern whose corners are substantially 90°. Further, depending on the tone of the resist developing process, the intersection 206-i may become an island-type resist pattern or a hole-type resist pattern. For example, when the intersection 206-i is kept in the developing process, the resulted resist pattern is an island-type resist pattern; and when the intersection 206-i is removed in the developing process, the resulted resist pattern is a hole-type resist pattern. Embodiments of the method 100 or the method 350 may be used to further refine the profile of the resist pattern.

Figure 34:
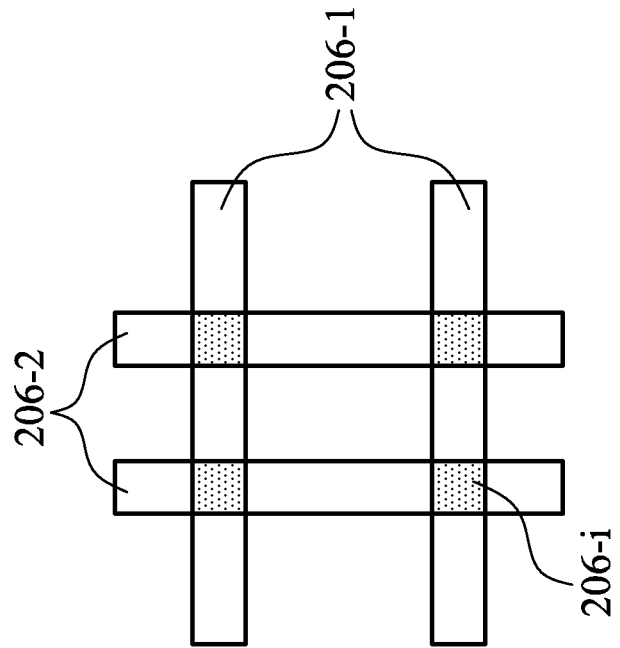
FIGS. 33 and 34 illustrate some exemplary layout designs that can benefit from the method of FIG. 29.
Figure 33:
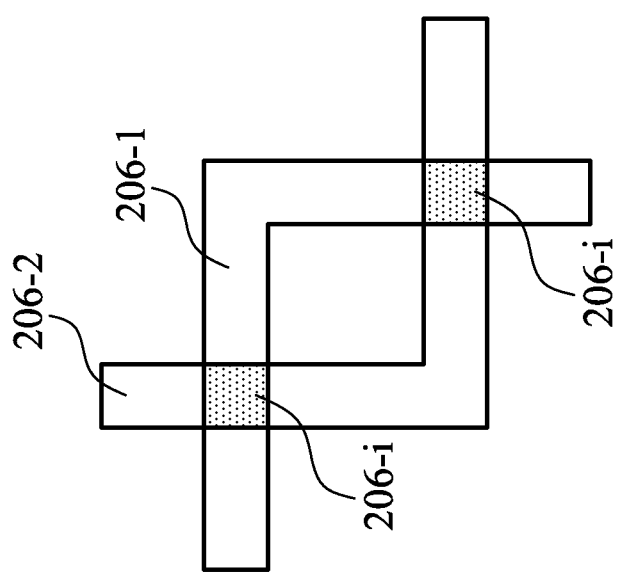

In various embodiments of the method 500, each of the first and the second resist regions 206-1 and 206-2 may include multiple elongated regions, and the intersections of the first and the second resist regions may form multiple rectangular resist patterns. One example is shown in FIG. 33, where each of the resist regions 206-1 and 206-2 is an L-shaped resist region and they form two intersections 206-i. Another example is shown in FIG. 34, where each of the resist regions 206-1 and 206-2 includes two (or more) parallel rectangles and they form four (or more) intersections 206-i.

Figure 35:
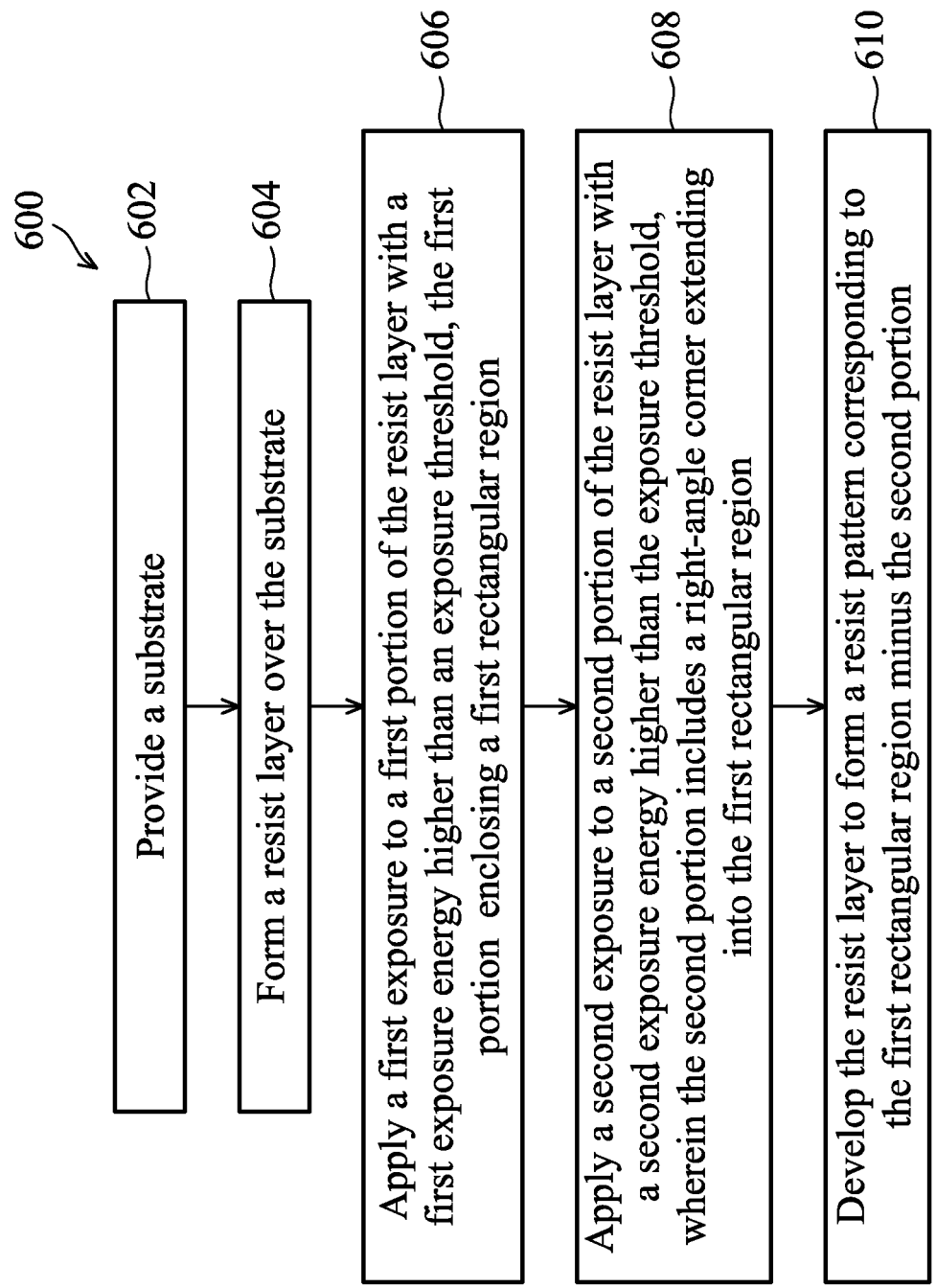
FIG. 35 illustrates a flow chart of another method for overcoming corner rounding issues during photolithography stage according to an embodiment of the present disclosure.

FIG. 35 illustrates a flow chart of a method 600 for overcoming corner rounding issues, particularly in inner corners of an L-shape or other more complex shapes, during photolithography exposure stages according to an embodiment of the present disclosure. FIG. 35 is discussed below in conjunction with FIGS. 36-39.

At operation 602, the method 600 provides a substrate, such as the substrate 202 of FIG. 3B. At operation 604, the method 600 forms a resist layer, such as the resist layer 206 of FIG. 4B or FIG. 18B, over the substrate. In embodiments, the method 600 may form one or more layers of material (e.g., a hard mask layer) between the substrate and the resist layer.

Figure 36:
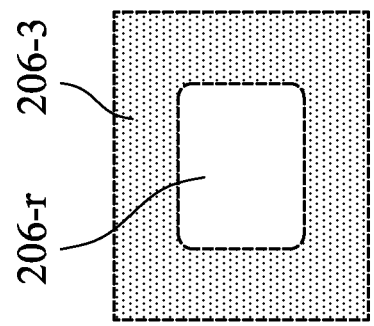

At operation 606, the method 600 applies a first exposure to a first portion 206-3 of the resist layer in a photolithography process, and the first portion 206-3 encloses a rectangular region 206-r. Referring to FIG. 36, the first exposure applies an exposure energy (or radiation energy) dosage above the exposure threshold of the resist material included in the resist layer. As a result, the first portion 206-3 is fully exposed by the first exposure, while the rectangular region 206-r is not exposed.

Figure 38:
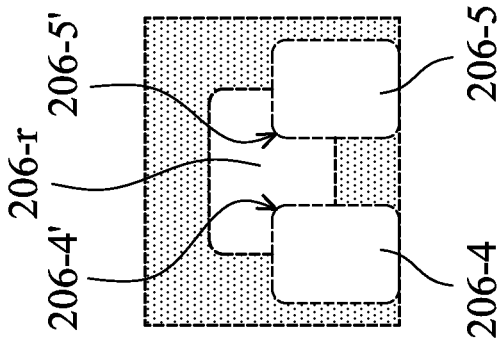
FIGS. 36, 37, 38, and 39 illustrate a photoresist layer during photolithography according to the method of FIG. 35, in accordance with an embodiment.
Figure 37:
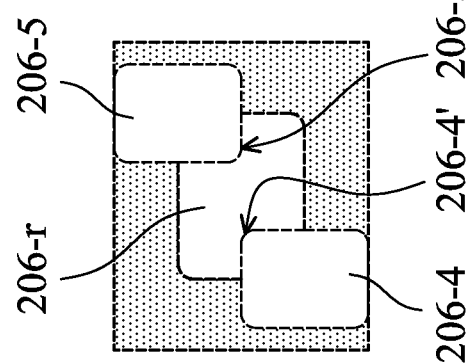

At operation 608, the method 600 applies a second exposure to a second portion 206-4 of the resist layer, and the second portion 206-4 includes a corner 206-4' extending into the rectangular region 206-r (FIG. 37). In the present embodiment, the second exposure also applies an exposure energy dosage above the threshold of the resist material. It is noted that the corner 206-4' is an outer corner of the resist portion 206-4. In the present embodiment, the method 600 applies optical proximity correction (OPC) techniques or other techniques such that the corner 206-4' has a substantially 90° angle. Further, operation 608 may expose more than one portion of the resist layer that has corners extending into the rectangular region 206-r. In the examples shown in FIGS. 37 and 38, another portion 206-5 is also exposed and has a corner 206-5' extending into the rectangular region 206-r. The corner 206-5' also has a substantially 90° angle. In FIG. 37, the corners 206-4' and 206-5' extend into the rectangular region 206-r from two diagonally opposite corners of the rectangular region 206-r, thereby resulting in a Z-shaped unexposed region. In FIG. 38, the corners 206-4' and 206-5' extend into the rectangular region 206-r from two opposite corners of the rectangular region 206-r along a same side of the rectangular region 206-r, thereby resulting in a T-shaped unexposed region. Various other shapes of unexposed region are contemplated and can be constructed by the method 600.

After the operations 606 and 608, the unexposed resist region includes the rectangular region 206-r minus the portions 206-4 and 206-5 (and any other portions that may extend into the rectangular region 206-r). It has been found that it is generally easier to make outer corners of a shape (e.g., an L-shape or a rectangle) to be right angles than inner corners because optical proximity correction (OPC) techniques are generally more effective for outer corners than inner corners. For example, for outer corners, OPC techniques may generally expand the shape and/or add assistant patterns near the outer corners, and there is generally enough room for the shape expansion and/or assistant pattern addition. In contrast, for inner corners, OPC techniques may generally contract the shape near the inner corners but the contraction is generally limited by nearby shapes including nearby inner corners. It is noted that the corners 206-4' and 206-5' are outer corners of the respective exposed region, but become the inner corners of the unexposed region. By implementing operations 606 and 608, the method 600 effectively improves the profile of inner corners of the unexposed region which is the target pattern.

Figure 39:
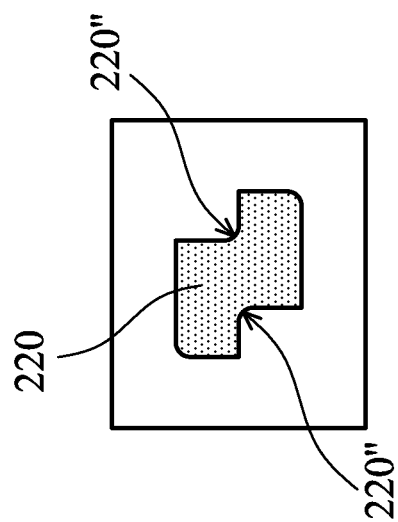

At operation 610, the method 600 develops the resist layer to form a resist pattern 220 corresponding to the rectangular region 206-r minus the portions 206-4 and 206-5 (and any other portions that may extend into the rectangular region 206-r). The resist pattern 220 has inner corners 220" that are substantially 90 degrees, such as shown in FIG. 39, which results from FIG. 37.

It is noted that the present disclosure discusses various embodiments of the inventive concept. The various embodiments are not isolated from each other. Rather, various parts of embodiments of the present disclosure may be combined to form new embodiments. For example, embodiments of the method 500 may be combined with embodiments of the method 100 or the method 350 to overcome corner rounding issues in the formation of resist patterns. For another example, embodiments of the method 400 may be combined with embodiments of the method 600 to overcome corner rounding issues, particularly in inner corners of a shape. Furthermore, an embodiment of the method 300 (FIG. 16) may apply a dual ion treatment to a resist pattern such as shown in FIG. 17 to improve the outer corners of an HM pattern that is transferred from the treated resist pattern, and apply another dual ion treatment to the HM pattern such as shown in FIG. 23 to improve the inner corners of a final pattern that is transferred from the treated HM pattern. By implementing two dual ion treatments, both inner corners and outer corners of the final pattern are improved to have substantially 90° angles. Various other combinations of the embodiments are contemplated.

Although not intended to be limiting, the present disclosure provides many benefits. For example, various embodiments of the present disclosure can be applied in photolithography processes to overcome corner rounding issues in patterns. Masking elements (either etch masks or ion implantation masks) produced by embodiments of the present disclosure have improved profile in their corners, such as having substantially 90° corners.

In one exemplary aspect, the present disclosure is directed to a method for semiconductor manufacturing. The method includes providing a substrate and a patterning layer over the substrate; forming a hole in the patterning layer; applying a first directional etching along a first direction to inner sidewalls of the hole; and applying a second directional etching along a second direction to the inner sidewalls of the hole, wherein the second direction is different from the first direction.

In another exemplary aspect, the present disclosure is directed to a method for semiconductor manufacturing. The method includes providing a substrate and a patterning layer over the substrate; forming a pattern in the patterning layer, the pattern having an island; applying a first directional treatment to at least outer sidewalls of the island along a first direction; and applying a second directional treatment to at least the outer sidewalls of the island along a second direction different from the first direction, the first and second directional treatments collectively resulting in different etch resistance in corner portions of the island than in non-corner portions of the island.

In yet another exemplary aspect, the present disclosure is directed to a method for semiconductor manufacturing. The method includes providing a substrate; forming a resist layer over the substrate; applying a first exposure to a first portion of the resist layer with a first exposure energy higher than an exposure threshold of the resist layer, wherein the first portion surrounds four sides of a first rectangular region; applying a second exposure to a second portion of the resist layer with a second exposure energy higher than the exposure threshold of the resist layer, wherein the second portion includes a first right-angle corner extending into the first rectangular region; and developing the resist layer to form a resist pattern corresponding to the first rectangular region minus the second portion.

In yet another exemplary aspect, the present disclosure is directed to a method for semiconductor manufacturing. The method includes providing a substrate having a hard mask layer; forming a hard mask pattern in the hard mask layer; implanting a first ion species into the hard mask pattern along a first direction; implanting the first ion species into the hard mask pattern along a second direction different from the first direction, wherein the first ion species and sidewalls of the hard mask pattern form a chemical compound; and etching the hard mask pattern using an etchant that is a selective to the chemical compound.

In yet another exemplary aspect, the present disclosure is directed to a method for semiconductor manufacturing. The method includes providing a substrate; forming a photoresist layer over the substrate; applying a first exposure to a first elongated region of the photoresist layer with a first exposure energy lower than an exposure threshold of the photoresist layer; applying a second exposure to a second elongated region of the photoresist layer with a second exposure energy lower than the exposure threshold of the photoresist layer, wherein the first and second elongated regions are oriented lengthwise perpendicular to each other and overlap in a common region having a rectangular shape; and developing the photoresist layer to form a resist pattern corresponding to the common region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor manufacturing, comprising:
providing a substrate and a patterning layer over the substrate, wherein the patterning layer has substantial uniform thickness across the entire substrate;
removing a first portion of the patterning layer to form a hole in the patterning layer;
applying a first directional etching along a first direction to two opposing inner sidewalls of the hole to remove a second portion of the patterning layer; and
applying a second directional etching along a second direction to another two opposing inner sidewalls of the hole to remove a third portion of the patterning layer, wherein the second direction is different from the first direction.

2. The method of claim 1, wherein the patterning layer includes a photoresist.

3. The method of claim 1, wherein the patterning layer includes a hard mask layer.

4. The method of claim 1, wherein the second direction is perpendicular to the first direction.

5. The method of claim 1, further comprising:
etching the substrate through the hole.

6. The method of claim 1, wherein the first and second directional etching are applied simultaneously.

7. The method of claim 1, wherein the hole is a substantially rectangular pattern.

8. The method of claim 1, wherein the hole is a substantially L-shaped pattern.

9. A method for semiconductor manufacturing, comprising:
providing a substrate;
forming a resist layer over the substrate;

applying a first exposure to a first portion of the resist layer with a first exposure energy higher than an exposure threshold of the resist layer, wherein the first portion surrounds four sides of a first rectangular region;

applying a second exposure to a second portion of the resist layer with a second exposure energy higher than the exposure threshold of the resist layer, wherein the second portion includes a first right-angle corner extending into the first rectangular region; and developing the resist layer to form a resist pattern corresponding to the first rectangular region minus the second portion.

10. The method of claim 9, wherein the second portion includes a second right-angle corner extending into the first rectangular region.

11. The method of claim 10, wherein the first and second right-angle corners extend into the first rectangular region from two diagonally opposite corners of the first rectangular region.

12. The method of claim 10, wherein the first and second right-angle corners extend into the first rectangular region from two opposite corners of the first rectangular region along a same side of the first rectangular region.

* * * * *